United States Patent
Sugita et al.

(10) Patent No.: US 9,793,653 B2
(45) Date of Patent: Oct. 17, 2017

(54) CONTROLLER UNIT

(71) Applicant: JTEKT CORPORATION, Osaka-shi (JP)

(72) Inventors: Kazuhiro Sugita, Chiryu (JP); Yasunori Tsuboi, Toyota (JP); Koji Hasegawa, Ichinomiya (JP); Sutemaro Kato, Kariya (JP)

(73) Assignee: JTEKT CORPORATION, Osaka-shi (JP)

( * ) Notice: Subject to any disclaimer, the term of this patent is extended or adjusted under 35 U.S.C. 154(b) by 0 days.

(21) Appl. No.: 15/235,705

(22) Filed: Aug. 12, 2016

(65) Prior Publication Data
US 2017/0062988 A1    Mar. 2, 2017

(30) Foreign Application Priority Data
Aug. 24, 2015    (JP) .................................. 2015-164575

(51) Int. Cl.
*H01R 13/642*    (2006.01)
*F16P 1/00*    (2006.01)

(52) U.S. Cl.
CPC .............. *H01R 13/642* (2013.01); *F16P 1/00* (2013.01)

(58) Field of Classification Search
CPC .............................. H01R 13/64; H01R 13/642
See application file for complete search history.

(56) References Cited

U.S. PATENT DOCUMENTS

| | | | | |
|---|---|---|---|---|
| 3,617,985 A * | 11/1971 | Kehl | ...................... | H01R 23/10 439/341 |
| 3,652,899 A * | 3/1972 | Henschen | .............. | H01R 23/68 361/784 |
| 4,843,223 A * | 6/1989 | Shino | ................... | G06K 7/0021 235/441 |
| 5,273,462 A * | 12/1993 | Huser | ................... | H01R 13/645 439/341 |
| 5,476,392 A * | 12/1995 | Inaba | ........................ | B60L 3/00 439/341 |
| 6,332,795 B1 * | 12/2001 | Conorich | ......... | H01R 13/62933 439/188 |
| 7,442,064 B2 * | 10/2008 | Miwa | ..................... | H01R 43/26 439/326 |

FOREIGN PATENT DOCUMENTS

JP    4-55184 U    5/1992
JP    2009-276894    11/2009

\* cited by examiner

*Primary Examiner* — James Harvey
*Assistant Examiner* — Oscar C Jimenez
(74) *Attorney, Agent, or Firm* — Oblon, McClelland, Maier & Neustadt, L.L.P.

(57) ABSTRACT

A controller unit includes: a base unit having a slot; a module that includes a printed circuit board and that is mounted on the base unit; a pair of male and female connectors, one being included in the base unit and the other being included in the module; and a turning support that allows the module to be turned with respect to the base unit. A pair of a recess and a projection are provided to prevent wrong attachment. The base unit has one of the recess and the projection and the module has the other. The positions of the recess and the projection vary depending on the type of module.

8 Claims, 12 Drawing Sheets

CONTROLLER UNIT

INCORPORATION BY REFERENCE

The disclosure of Japanese Patent Application No. 2015-164575 filed on Aug. 24, 2015 including the specification, drawings and abstract, is incorporated herein by reference in its entirety.

BACKGROUND OF THE INVENTION

1. Field of the Invention

The present invention relates to controller units that prevent wrong attachment of modules in the case where a plurality of types of modules are to be attached to a base unit.

2. Description of the Related Art

The controller units are what is called programmable logic controllers (PLCs), which are control devices that sequentially perform the steps of control in predetermined order or according to predetermined procedures. For example, a safety door is installed around a machine tool that machines workpieces. The safety door is installed to separate the operator from the machine tool to ensure operator's safety. A machining start button for starting machining of the machine tool may be provided at a position slightly away from the safety door, and an emergency stop button may be provided next to the machining start button. The safety door may be provided with a limit switch that detects if the safety door is open or closed. The machine tool may be provided with a predetermined sensor that detects completion of machining.

In this case, the controller unit receives a signal from the limit switch, a signal from the machining start button, a signal from the emergency stop button, and a signal from the predetermined sensor, and outputs an operation start control signal that starts operation of the machine tool and an operation stop control signal that stops operation of the machine tool. The controller unit performs the steps of control (e.g., starts operation of the machine tool, and stops operation of the machine tool if it detects completion of machining) only if it detects a predetermined order (e.g., if it detects that the machining start button is turned on after the safety door is closed). For example, if the machine tool is in operation when the controller unit detects depression of the emergency stop button or detects that the safety door is opened, the controller unit stops the machine tool.

The controller unit includes a base unit and modules. Each module includes a printed circuit board and a casing having the printed circuit board mounted therein. The base unit has slots or spaces where the modules are to be mounted. A plurality of types of modules are mounted in the slots of the base unit. Each module is mounted by fitting a pair of male and female connectors together. One of the connectors is included in the base unit, and the other is included in the module. The types of modules include a power supply module, a central processing unit (CPU) module, a communication module, an input module, an output module, etc.

Mounting a wrong type of module on a base unit can cause breakdown of an electronic circuit component mounted on the printed circuit board of the module. The modules are mounted on the base unit by connecting the connectors together, but signals connected to the module and their arrangement vary depending on the type of module. Accordingly, the type of module to be mounted in each slot is decided in advance. In order to avoid electrical failure resulting from mounting of a wrong module, the size (number of pins) of connectors or the attached positions of the connectors are varied depending on the type of module, and this variation provides a structure for preventing wrong insertion. For example, if the power supply module and another module are switched and the power supply module is mounted in the slot of the base unit in which the module other than the power supply module is supposed to be mounted, an excessive voltage is applied to the electronic circuit component of this module, which may result in breakdown of the electronic circuit component. Various proposals are conventionally made in order to prevent wrong mounting of modules. See, e.g., Japanese Utility Model Application Publication No. H04-55184 (JP H04-55184 Y) and Japanese Patent Application Publication No. 2009-276894 (JP 2009-276894 A).

One of methods for mounting a module to a base unit is to provide a detachable turning support configuration between the base unit and the module and turn the module with respect to the base unit so that a connector included in the module is fitted to a connector included in the base unit.

In the above mounting methods that are conventionally proposed in order to prevent wrong attachment, the module is not turned but is linearly pressed into the slot in order to attach the module to the base unit. In the method in which the module is turned and attached to the base unit, the module is turned around a turning support. Accordingly, even a wrong module may be able to be fitted into the slot by the turning operation, even if not completely. Namely, a part of the connector of the wrong module may be able to be fitted to the connector of the base unit. If the operator thinks that the module just need be pressed harder to press the connector into the insertion hole, or the connector cannot be inserted smoothly because it is inserted slightly obliquely, etc. without being aware of the fact that he/she is trying to attach a wrong module, he/she may press the module too hard that the connector may be damaged. A proposal for effectively preventing wrong attachment is therefore desired even for the mounting method using turning of modules.

SUMMARY OF THE INVENTION

It is one object of the present invention to reliably prevent wrong attachment and prevent damage to connectors in a mounting method in which a plurality of types of modules are turned and mounted on a base unit.

According to one aspect of the present invention, a controller unit includes: a base unit having a slot that is a space where a module is to be mounted; the module that includes a printed circuit board and that is mounted in the slot of the base unit; a pair of male and female connectors, one being included in the base unit and the other being included in the module in order to electrically connect the base unit to the module; and a turning support configuration of a fitting type that allows the module to be turned with respect to the base unit in order to join the pair of connectors together by turning of the module with respect to the base unit. The base unit has one of a pair of a recess and a projection and the module has the other such that the projection engages with the recess before the pair of connectors are connected together. The recess and the projection are located at positions separated from positions of the pair of connectors in the base unit and the module. A distance between the positions of the pair of connectors and the positions of the recess and the projection varies depending on a type of combination of the modules that cannot be wrongly joined to the slots.

According to the controller unit of the above aspect, the base unit has one of the pair of the recess and the projection, and the module has the other. The positional relationship between the recess and the projection is such that the projection can be fitted in the recess in the case where a correct module is mounted, and such that the projection cannot be fitted in the recess in the case where a wrong module is mounted. Fitting between the projection and the recess occurs before the pair of connectors in the base unit and the module start to be connected together by turning of the module. Accordingly, when a wrong module is going to be turned and mounted on the base unit, fitting between the projection and the recess is hindered before the pair of connectors start to be connected together by turning of the module, and further turning of the module is reliably hindered. This can avoid connection of a wrong pair of connectors and prevent damage to the connectors due to the connection of the wrong pair of connectors.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

An embodiment of the present invention will be described below with reference to the accompanying drawings.

Figure 1:
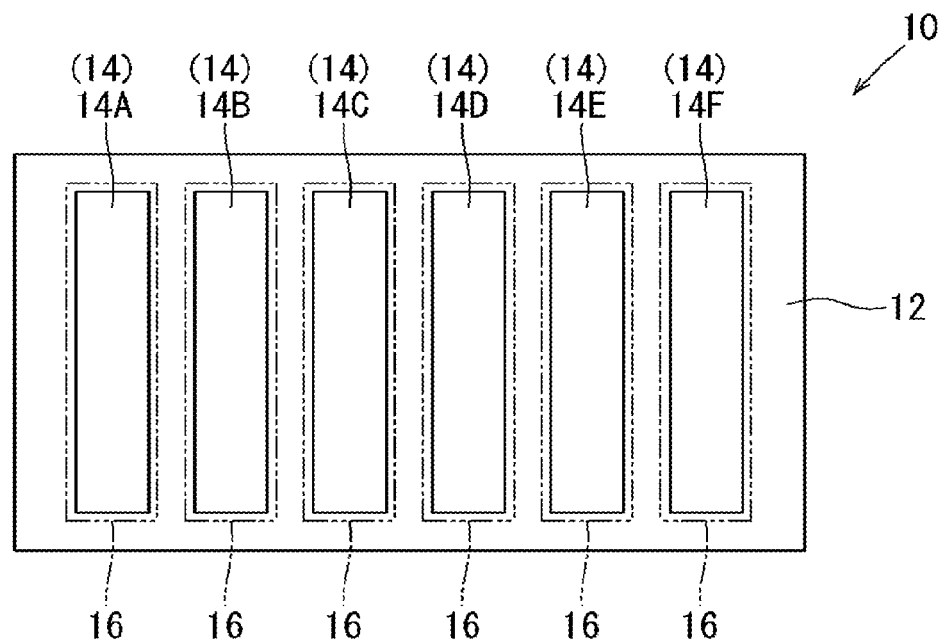
FIG. 1 is a schematic plan view showing the layout of a controller unit according to an embodiment of the present invention.

FIGS. 1 to 7 are views schematically showing the present embodiment in order to facilitate understanding. FIG. 1 is a schematic plan view showing the layout of a controller unit 10. The controller unit 10 is formed by a base unit 12 and modules 14. The modules 14 consist of a plurality of types of modules such as a power supply module 14A, a CPU module 14B, a communication module 14C, an input module 14D, and an output module 14E. In the following description of the drawings, those modules denoted by reference character "14" mean that there are a plurality of other types of modules 14B to 14E other than the power supply module 14A. As used herein, the term "mount" means attaching the modules 14 to the base unit 12 such that the modules 14 are electrically connected to the base unit 12, and a slot 16 refers to the space on the base unit 12 where the module 14 is to be mounted.

When the modules 14 are mounted on the base unit 12, wrong attachment between the power supply module 14A and the remaining modules 14B to 14E usually causes breakdown of an electronic circuit component. Wrong attachment among the modules other than the power supply module 14A, namely among the CPU module 14B, the communication module 14C, the input module 14D, and the output module 14E does not cause breakdown of an electronic circuit component. As used herein, the expression "the type of combination of the modules that cannot be wrongly joined to the slots" means the types of modules 14 that can cause breakdown of an electronic circuit component if wrongly attached.

Figure 2:
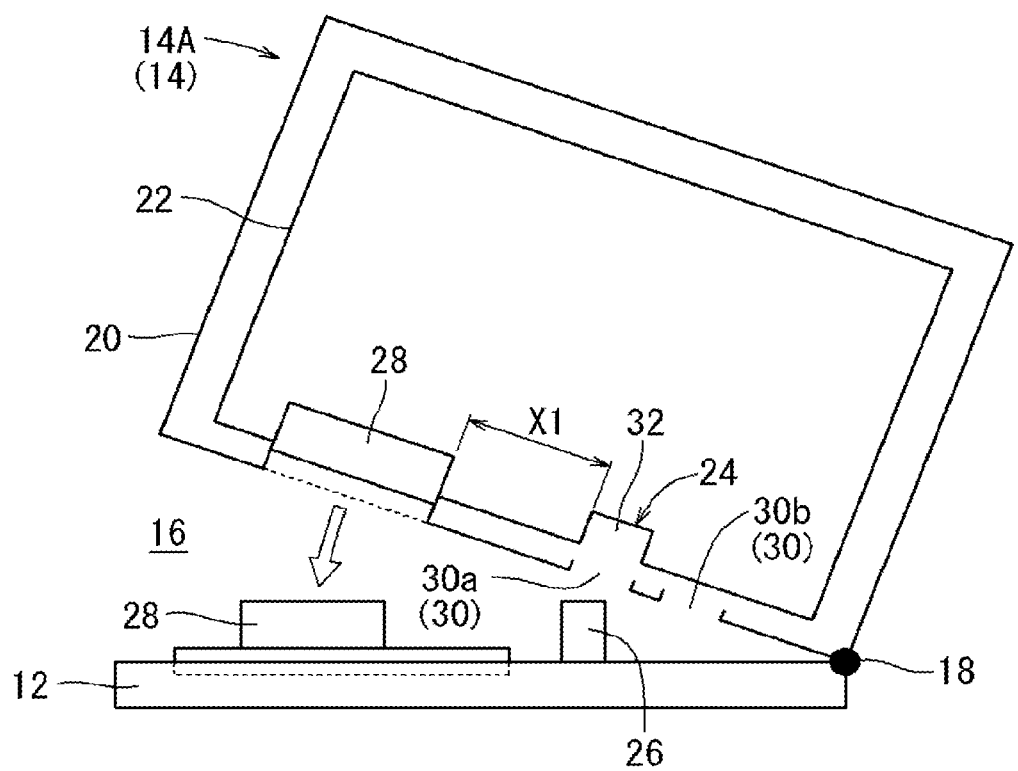
FIG. 2 is a diagram showing the state before mounting in the case where a certain type of module is turned and attached to a base unit.
Figure 3:
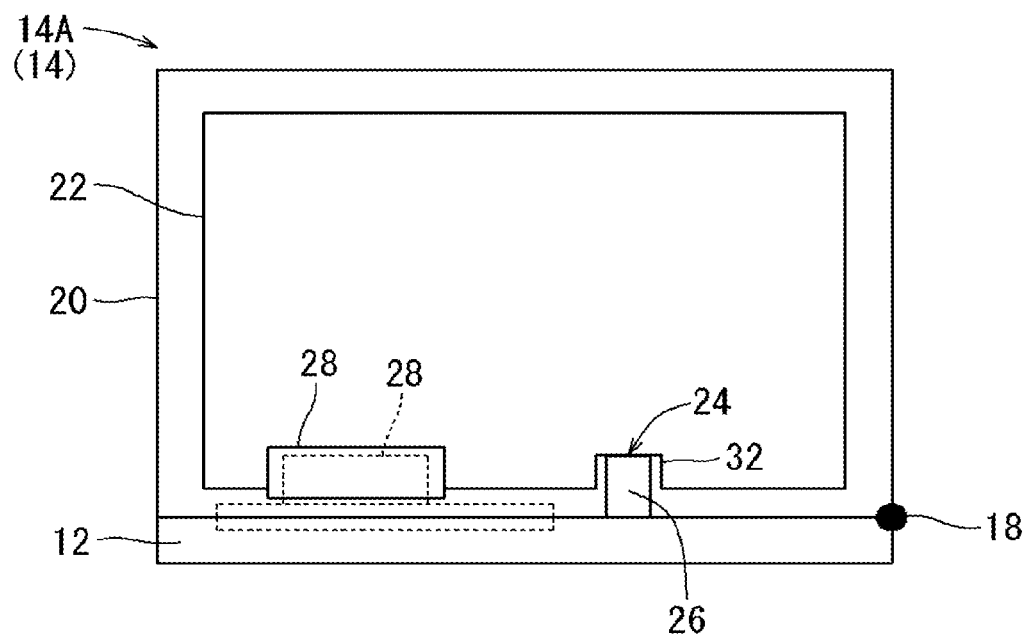
FIG. 3 is a diagram showing the state after mounting in FIG. 2.

FIGS. 2 to 5 are side views showing the state where the modules are turned and attached to the base unit. FIGS. 2 and 3 show an example in which the power supply module 14A is turned and attached to the base unit 12. FIG. 2 shows the state before mounting, and FIG. 3 shows the state after mounting. In the following description of this example, the description common to the remaining modules 14B to 14E is given using the common reference character "14," and the description specific to the power supply module 14A is given using the reference character "14A." The same applies to other examples described later.

As shown in FIGS. 2 and 3, the base unit 12 has on its surface the slot 16 or a space where the module 14 can be mounted. The power supply module 14A is placed at the position of the slot 16 such that the power supply module 14A can be turned about a turning support 18 serving as a turning center. The turning support 18 is formed so that the module 14 is detachably fitted on the base unit 12. The structure of the turning support 18 will be described in detail later.

The module 14 is formed by a box-shaped case 20 and a printed circuit board 22. The printed circuit board 22 is mounted and placed in the casing 20.

A pair of male and female connectors 28 are placed on the mating portions of the base unit 12 and the module 14 which face each other when the module 14 is turned and attached to the base unit 12. One of the male and female connectors 28 is placed on the base unit 12, and the other is placed on the module 14. Specifically, in the present embodiment, one of the male and female connectors 28 is placed on the surface of the base unit 12, and the other is placed in the lower part of the printed circuit board 22 of the module 14, as viewed in FIGS. 2 and 3. The pair of connectors 28 are fitted and joined together as shown in FIG. 3, whereby the module 14 is electrically connected to the base unit 12.

The base unit 12 and the module 14 have a recess 24 and a projection 26 in order to prevent wrong attachment. In the present embodiment, the module 14 has the recess 24 and the base unit 12 has the projection 26. The recess 24 and the projection 26 are located between the turning support 18 and the positions where the connectors 28 are placed.

The recess 24 in the module 14 is formed by holes 30 formed in the casing 20 and a recessed shape 32 formed in the lower side portion of the printed circuit board 22. The number of holes 30 formed in the casing 20 is the same as the number of types of modules 14 described above. In the present embodiment, two holes 30 are formed in the casing 20. This is in order to allow the same casing 20 to be used for the modules 14 having the recess 24 at different positions as shown in FIGS. 2 and 3 and in FIGS. 4 and 5. This can reduce the number of parts. Since the casing with the same shape can be used for each module 14, the number of dies required to form the casing 20 can be reduced, whereby production cost can be reduced.

In the recess 24 formed by the holes 30 and the recessed shape 32 according to the present embodiment, the holes 30 have a larger size in the lateral direction than the recessed shape 32 as viewed in FIGS. 2 and 3. This is because the recess 24 needs a larger insertion width at its opening than at its inner part in order to allow the projection 26 to be inserted into the recess 24 when the module 14 is turned. Making the width of the recess 24 smaller at its inner part than at its opening improves holding stability for the projection 26 at the time the projection 26 is inserted. Forming the recess 24 having such a shape allows the projection 26 to be smoothly inserted into the recess 24.

In the present embodiment, the positional relationship between the recess 24 and the projection 26 to be fitted together and the positional relationship between the pair of connectors 28 to be fitted together are such that, when the projection 26 is going to be fitted into the recess 24, any offset contact between the recess 24 and the projection 26 would occur before the pair of connectors 28 contact each other. As used herein, the term "offset contact" refers to the state where the projection 26 contacts a portion other than the recess 24 and the module 14 cannot be turned any more, or further turning of the module 14 is hindered. The function to stop turning of the module 14 is therefore carried out by the offset contact between the recess 24 and the projection 26, and the connectors 28 for electrical connection are not subjected to a load that is applied by turning of the module 14. The connectors 28 for electrical connection can thus be protected.

The heights (turning positions) of the recess 24 and the projection 26 which are required to hinder turning of the module 14 before the connectors 28 contact each other in case of wrong insertion of the projection 26 into the recess 24 can be determined by simulation using computer-aided design (CAD) and can also be determined so as to satisfy the expression "$\theta 1 \leq \theta 2$," where $\theta 1$ represents an angle that is formed between the edge of the casing 20 and the upper surface of the base unit 12 at the time the pair of connectors 28 contact each other by turning of the module 14, and $\theta 2$ represents an angle that is formed between the edge of the casing 20 and the upper surface of the base unit 12 at the time the projection 26 of the base unit 12 contacts the edge of the printed circuit board 22 of the module 14.

Figure 4:
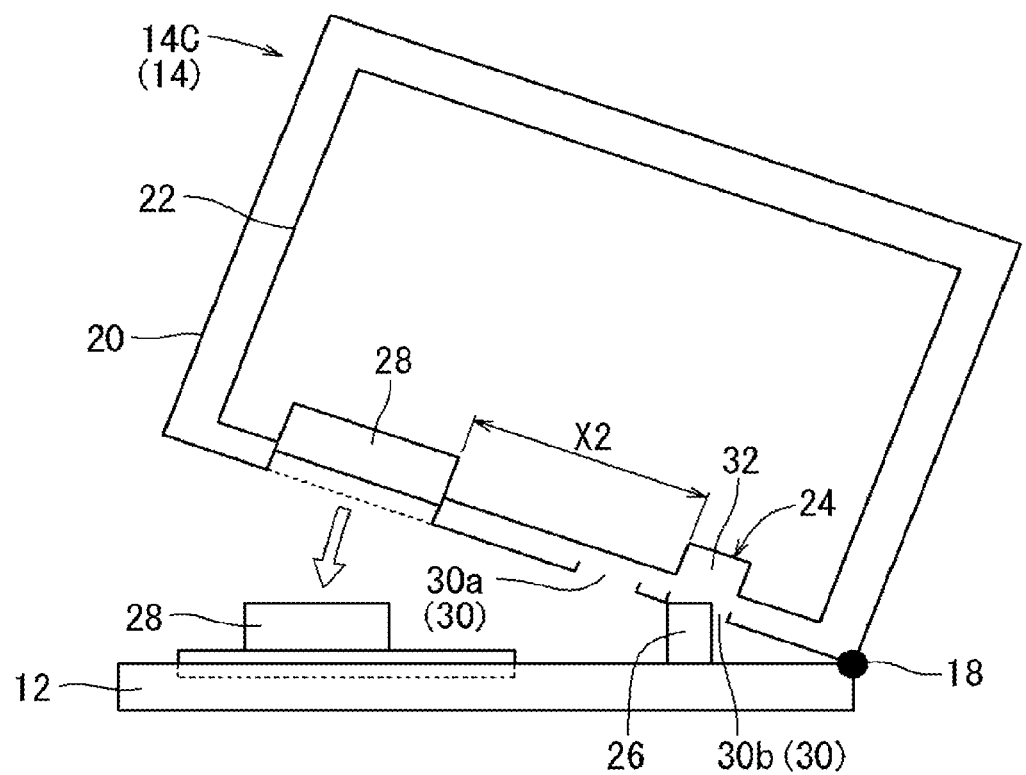
FIG. 4 is a diagram showing the state before mounting in the case where a different type of module is turned and attached to a base unit.
Figure 5:
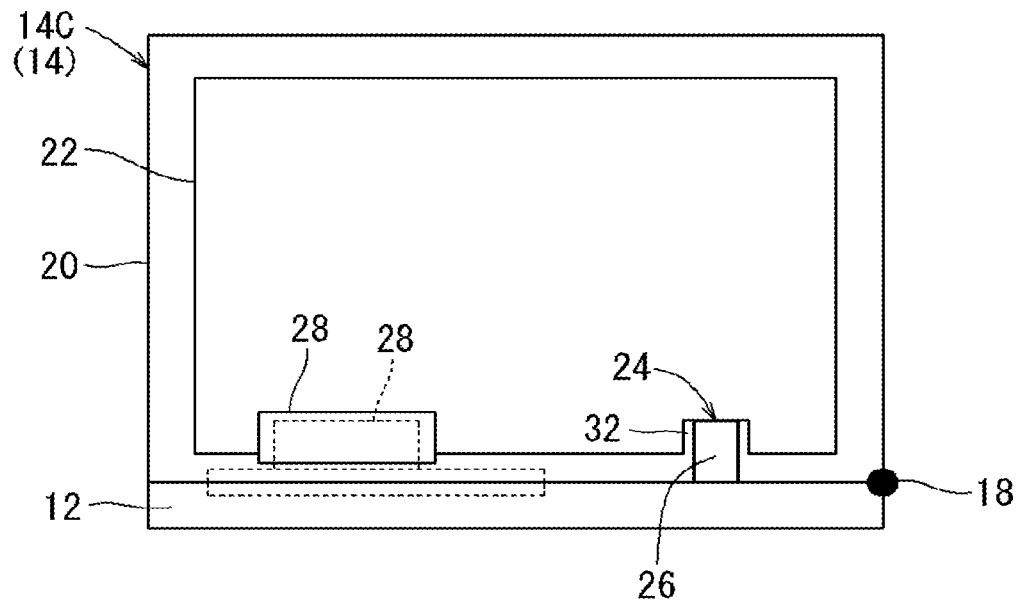
FIG. 5 is a diagram showing the state after mounting in FIG. 4.

FIGS. 4 and 5 show another example in which the communication module 14C is turned and attached to the base unit 12. FIG. 4 shows the state before mounting, and FIG. 5 shows the state after mounting. In FIGS. 4 and 5, the portions having substantially the same configuration as that of the power supply module 14A shown in FIGS. 2 and 3 are denoted with the same reference characters, and detailed description thereof will be omitted.

The configuration of the communication module 14C is different from that of the power supply module 14A in the distance between the position of the connectors 28 and the position of the recess 24 and the projection 26 which are provided to prevent wrong attachment. In the power supply module 14A shown in FIGS. 2 and 3, the recess 24 and the projection 26 are located substantially in the middle between the turning support 18 and the connectors 28, and the distance between the connectors 28 and the recess 24 and the projection 26 is X1. In the communication module 14C, however, the recess 24 and the projection 26 are located closer to the turning support 18, and the distance between the connectors 28 and the recess 24 and the projection 26 is X2. That is, the distance X2 is larger than the distance X1 (X1<X2).

As can be seen from the position of the connector 28 of the power supply module 14A shown in FIGS. 2 and 3 and the position of the connector 28 of the communication module 14C shown in FIGS. 4 and 5, the connectors 28 of the present embodiment are disposed at the same position. Only the positions of the recess 24 and the projection 26 which are provided in order to prevent wrong attachment vary depending on the type of module 14. The connectors 28 of the modules 14 are thus located in line, which facilitate layout design.

Attachment of the module 14 of the present embodiment will be described. First, attachment of correct types of modules 14 to the base unit 12 will be described. FIG. 2 shows the state before mounting in the case where the power supply module 14A is correctly attached to the base unit 12. FIG. 4 shows the state before mounting in the case where the communication module 14C is correctly attached to the base unit 12. In either case, the recess 24 and the projection 26 which are provided in order to prevent wrong attachment are located at corresponding positions so that the projection 26 can be fitted in the recess 24. Accordingly, as the module 14 is turned about the turning support 18 serving as a turning center, the projection 26 of the base unit 12 can be fitted in the recess 24 of the module 14 as shown in FIGS. 3 and 5. The connectors 28 are thus joined together and the module 14 is electrically connected to the base unit 12.

Figure 6:
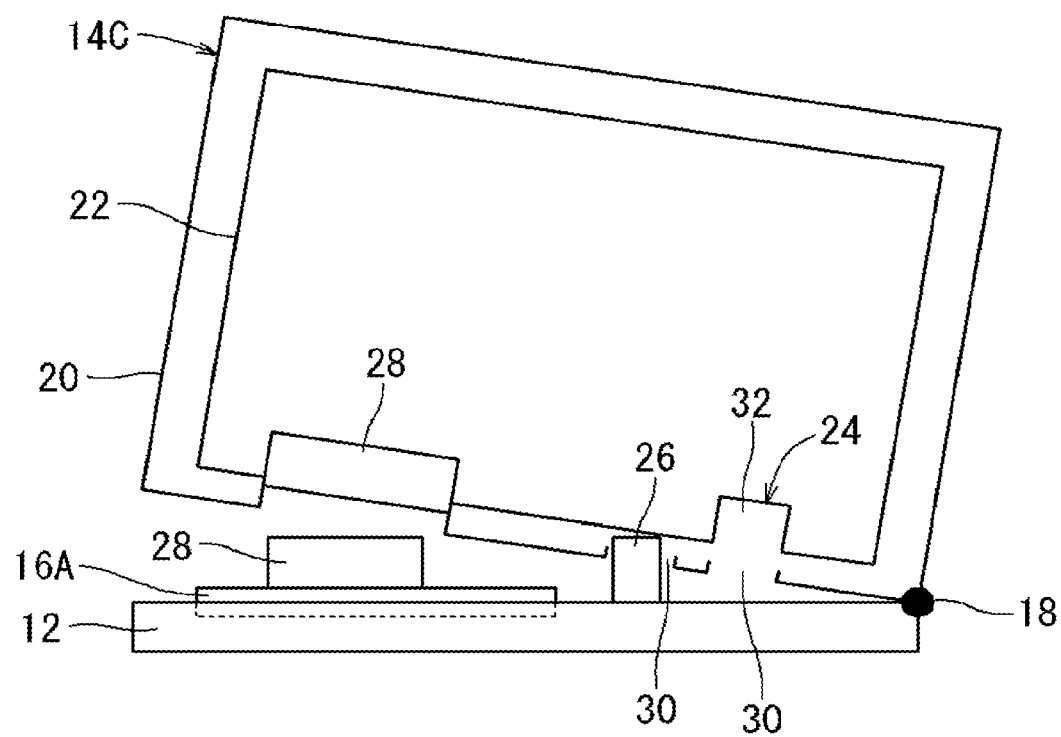
FIG. 6 is a diagram showing the case where a different type of module is going to be attached to a base unit for a certain type of module.
Figure 7:
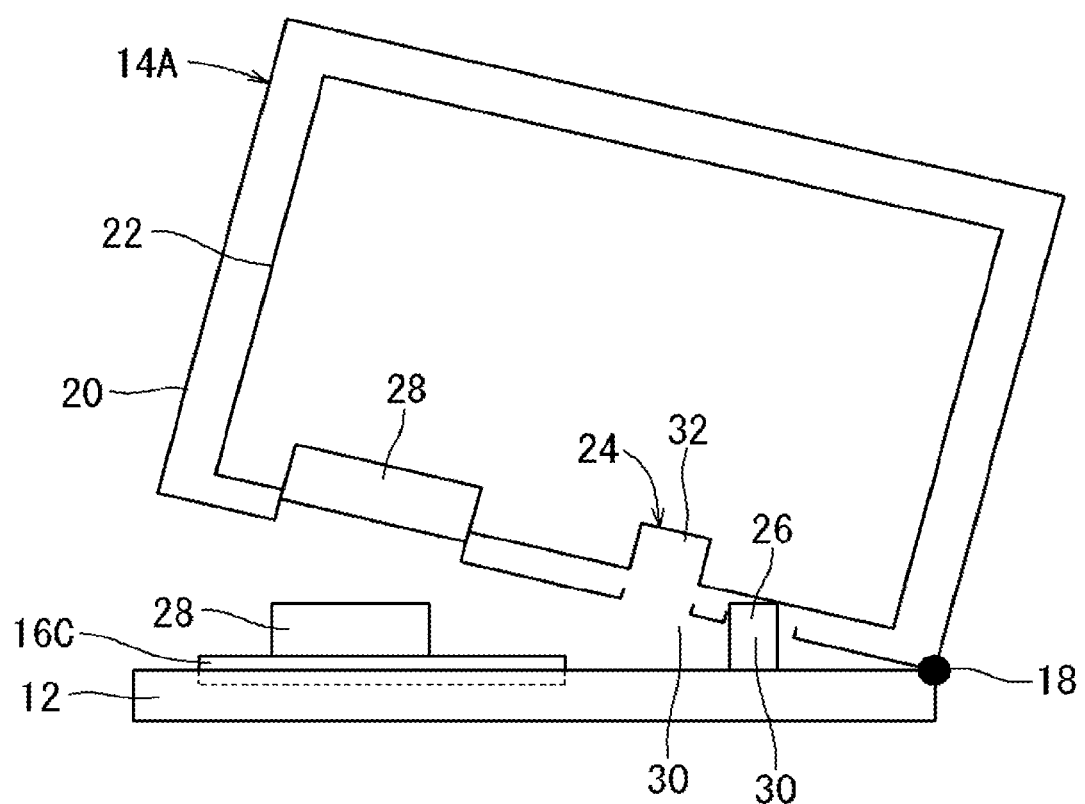
FIG. 7 is a diagram showing the case where a certain type of module is going to be attached to a base unit for a different type of module.

Next, an example in which a wrong type of module 14 is going to be attached to the base unit 12 will be described. FIG. 6 shows the case where the communication module 14C is wrongly attached to a slot 16A of the base unit 12 which corresponds to the power supply module 14A. FIG. 7 shows the case where the power supply module 14A is wrongly attached to a slot 16C of the base unit 12 which corresponds to the communication module 14C. In either case, the recess 24 and the projection 26 which are provided to prevent wrong attachment are located at positions separated from each other so that the projection 26 cannot be fitted in the recess 24. In the present embodiment, the recess 24 and the projection 26 are positioned such that, when the projection 26 is going to be fitted into the recess 24, any offset contact between the recess 24 and the projection 26 would occur before the connectors 28 are joined together. Even if the module 14 is turned about the turning support 18 serving as a turning center, the projection 26 of the base unit 12 cannot be fitted into the recess 24 of the module 14 as shown in FIGS. 6 and 7. Specifically, the tip end of the projection 26 of the base unit 12 contacts the edge of the printed circuit board 22 mounted in the module 14, so that further turning of the module 14 is hindered and the connectors 28 are prevented from being wrongly joined together. The connectors 28 are thus protected. In FIGS. 6 and 7, offset contact occurs due to the projection 26 contacting the edge of the printed circuit board 22 other than the recess 24. However, offset contact may be contact other than the contact with the edge of the printed circuit board 22 as long as the contact is with a portion other than the recess 24. For example, offset contact may be contact with the casing 20. In the case where the module 14 has the projection 26 and the base unit 12 has the recess 24, offset contact may be contact with a part of the base unit 12 other than the recess 24.

In the event of wrong attachment shown in FIGS. 6 and 7, turning of the module 14 is hindered with the projection 26 being fitted in the hole 30 other than the correct hole 30 of the casing 20 of the module 14. Since turning of the module 14 is hindered with the projection 26 being inserted and fitted in the hole 30 of the casing 20, the projection 26 is protected by the hole 30, whereby collapse or breakage of the projection 26 can be prevented.

Figure 8:
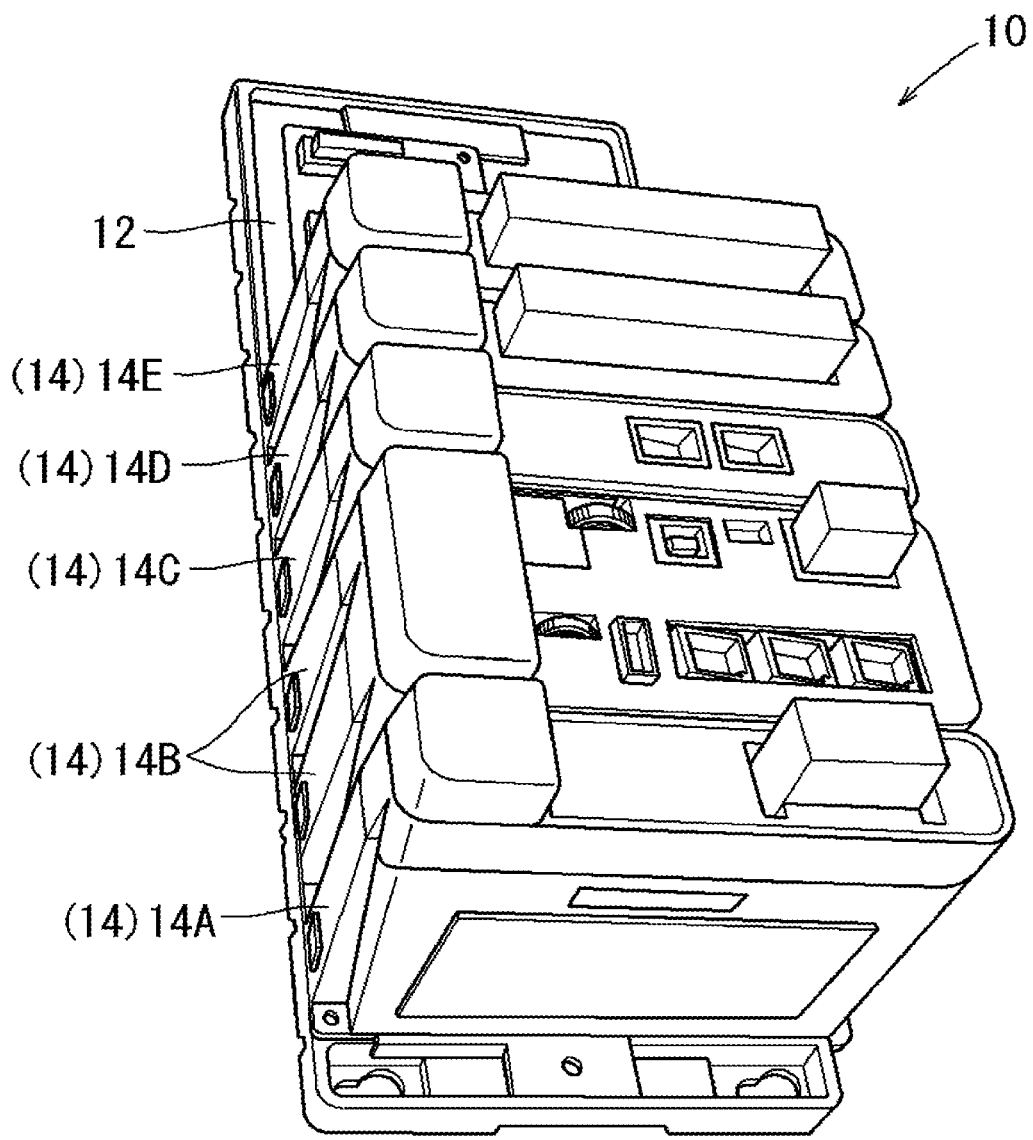
FIG. 8 is a perspective view as viewed from above, showing a specific example in which various modules have been attached to a base unit.

The configuration of the present embodiment will be specifically described below. FIG. 8 shows the state where the modules 14 have been mounted on the base unit 12. Although the configuration is not clearly shown in the figure, each module 14 is turned and attached to the base unit 12.

Figure 9:
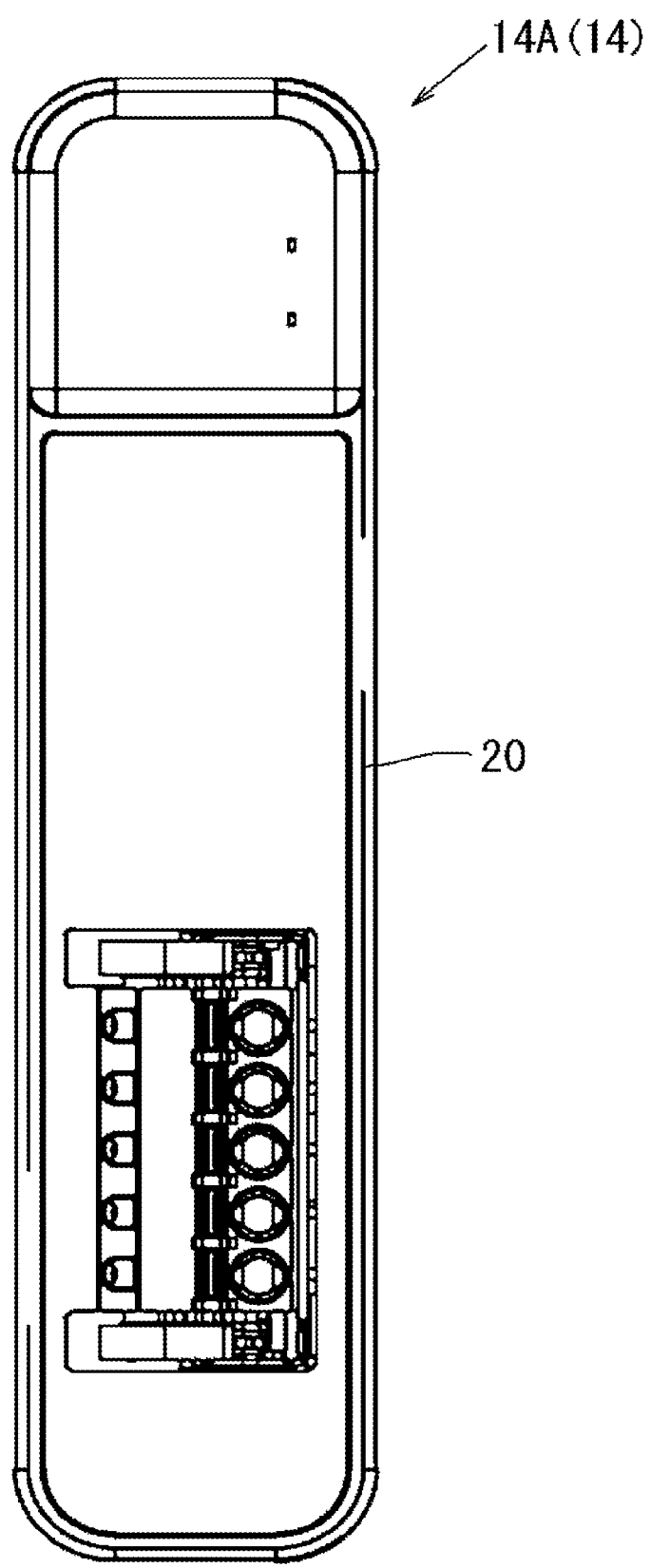
FIG. 9 is a front view showing a specific example of a power supply module.
Figure 10:
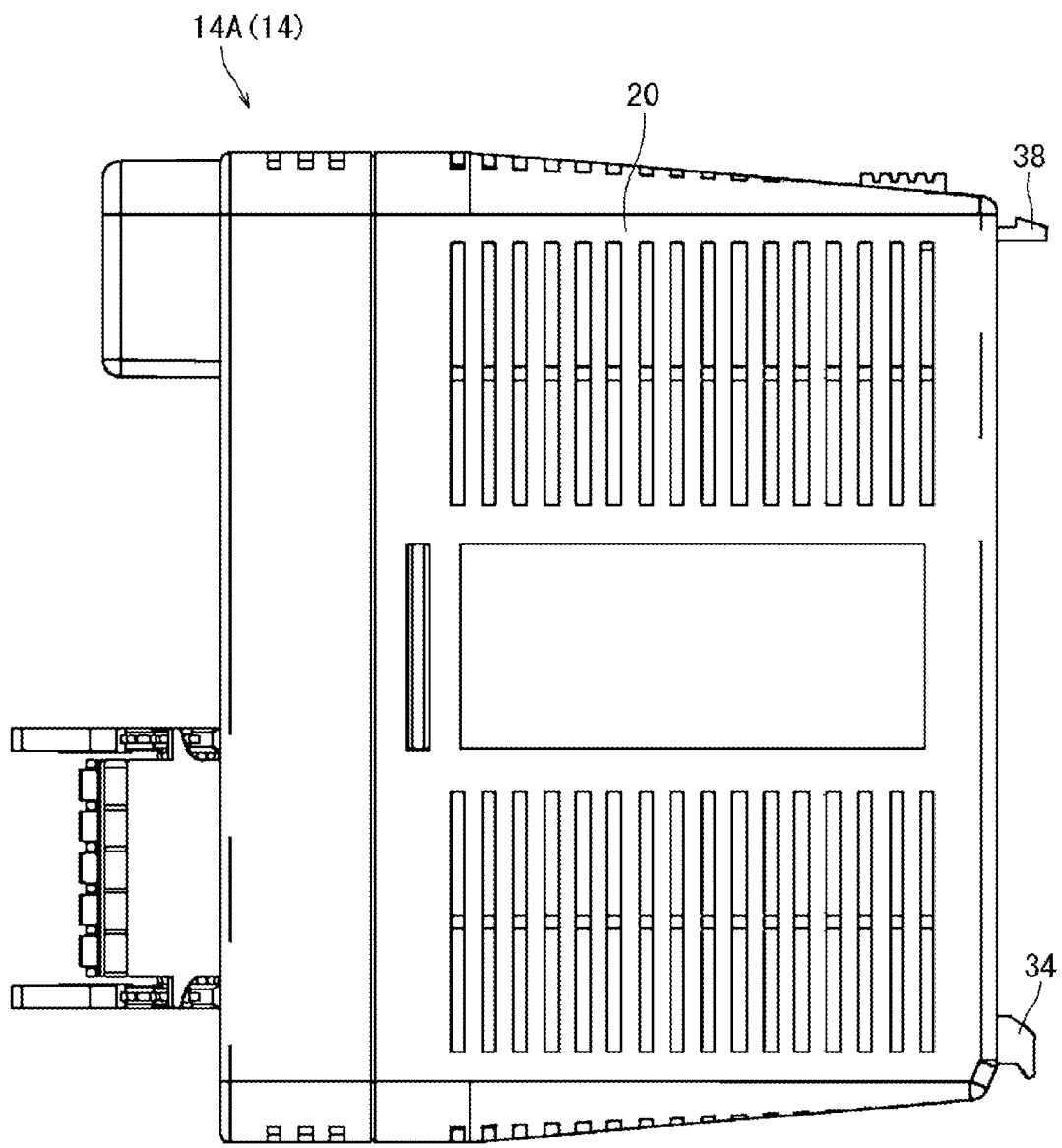
FIG. 10 is a side view of FIG. 9.
Figure 11:
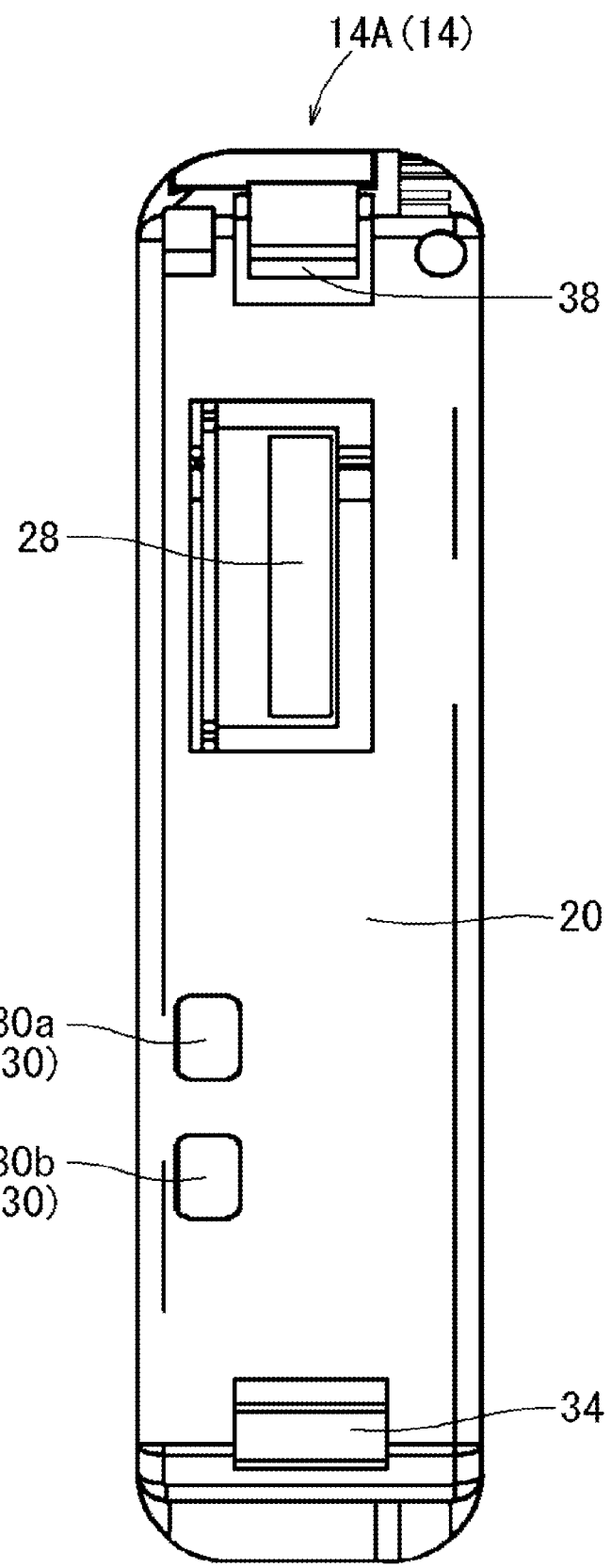
FIG. 11 is a bottom view of FIG. 9.

FIGS. 9 to 11 show a specific configuration of the power supply module 14A. FIG. 9 is a top view, FIG. 10 is a side view, and FIG. 11 is a bottom view. The power supply module 14A is formed by mounting the printed circuit board 22 (not shown in FIGS. 9 to 11) in the box-shaped casing 20. The casing 20 has the holes 30 in its bottom surface as shown in FIG. 11. In this example, the casing 20 has two holes 30a, 30b. The hole 30a is a hole for the power supply module 14A, and the hole 30b is a hole to be used in the case where the casing 20 is applied to the other modules 14B to 14E. The power supply module 14A of the present embodiment has the recessed shape 32 of the printed circuit board 22 at a position corresponding to the hole 30a.

As shown in FIGS. 10 and 11, the casing 20 has a support member 34 on one side of its bottom surface and a stopper member 38 on the other side of its bottom surface. The support member 34 forms the turning support 18 and the stopper member 38 stops turning of the module 14. The operations and configurations of the support member 34 and the stopper member 38 will be described later with reference to FIGS. 14 and 15. As shown in FIG. 11, the module 14 has one of the pair of male and female connectors 28 on its bottom surface.

Figure 12:
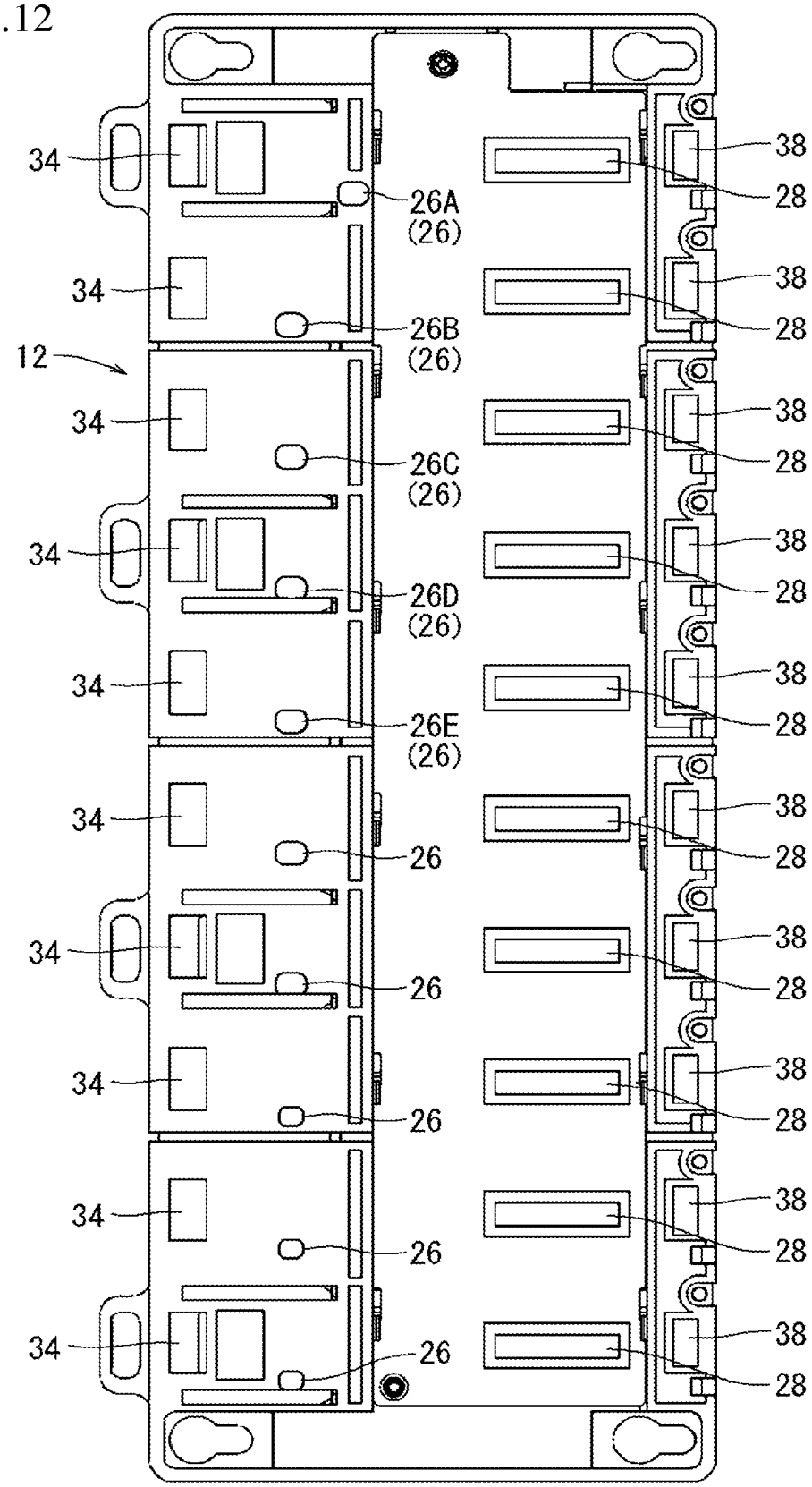
FIG. 12 is a plan view of a base unit.
Figure 13:
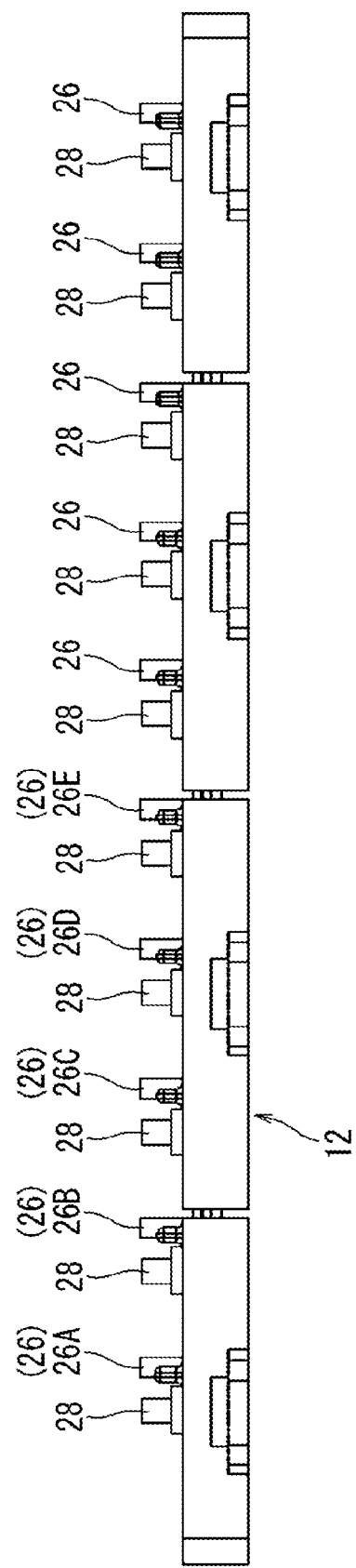
FIG. 13 is a side view of FIG. 12.

FIGS. 12 and 13 show a specific configuration of the base unit 12. FIG. 12 is a plan view and FIG. 13 is a side view. As shown in FIG. 12, the base unit 12 has the other ones of the pairs of male and female connectors 28 on its upper surface. The connectors 28 are disposed at the same position regardless of the type of module 14. The connectors 28 are therefore located in line on the upper surface of the base unit 12.

The base unit 12 also has the projections 26 for preventing wrong attachment on its upper surface. Of the projections 26, a projection 26A for the power supply module 14A is located at a different position from projections 26B to 26E for the remaining modules 14B to 14E. The projections 26 for the remaining modules 14B to 14E are located at the same position.

The base unit 12 further has support holes 36 on its one side and has retaining holes 40 on the other side. The support members 34 of the turning supports 18 of the modules 14 can be fitted in the support holes 36, and the stopper members 38 that stop turning of the modules 14 can be retained in the retaining holes 40. The operations and configurations of the support hole 36 and the retaining hole 40 will be described.

Figure 14:
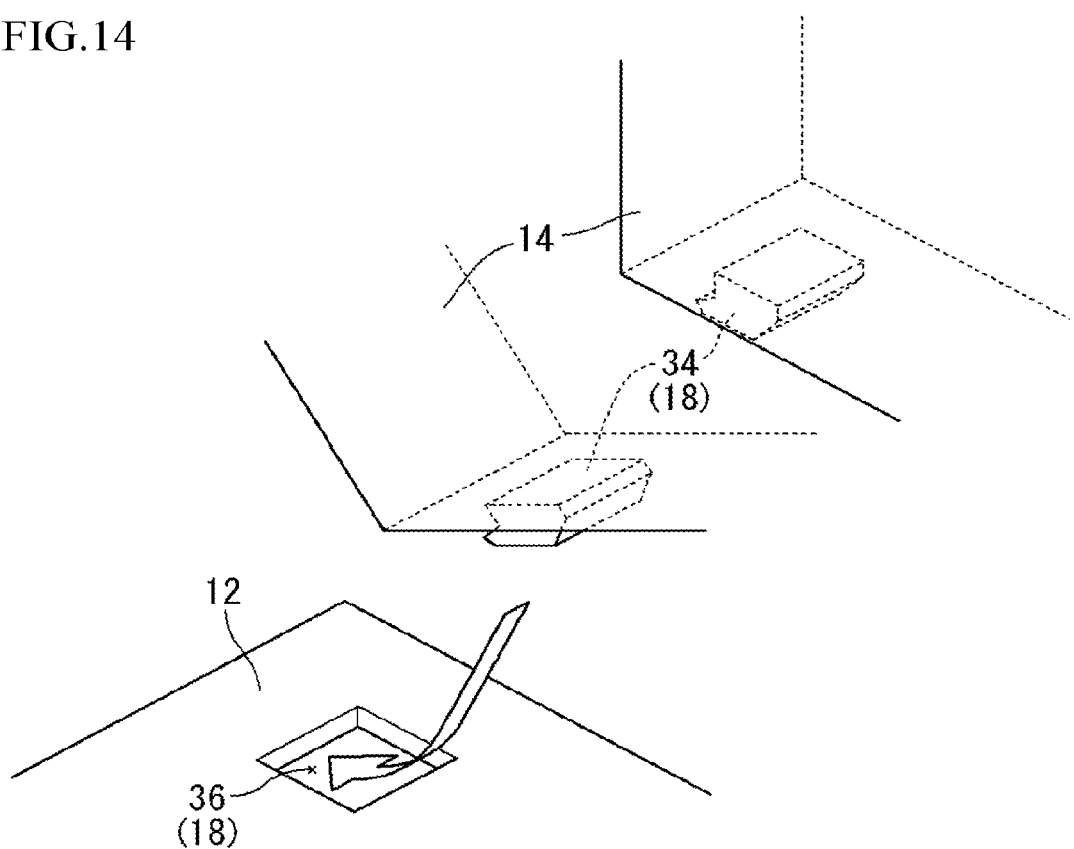
FIG. 14 is a schematic view showing the configuration of a turning support of a module.

FIG. 14 is an exploded view showing a concept of the configuration of the turning support 18. The base unit 12 has the support hole 36 in its upper surface, and the module 14 has the support member 34 on its lower surface. The support member 34 has a J-shaped section. The support member 34 is inserted and fitted in the support hole 36 to form the turning support 18 so that the module 14 can be turned with respect to the base unit 12. The module 14 is thus turned and mounted on the base unit 12.

Figure 15:
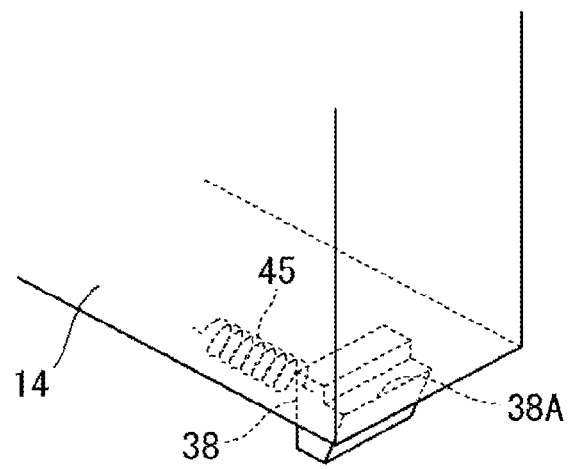
FIG. 15 is a schematic view showing the configuration that retains the module by the base unit after the module is turned.

FIG. 15 is an exploded view showing a concept of the retaining configuration at the time the module 14 is turned and mounted on the base unit 12. The base unit 12 has the retaining hole 40 in its upper surface, and the module 14 has the stopper member 38 placed in its lower part such that the stopper member 38 can move in the direction shown by an arrow. The stopper member 38 has a stopper claw 38A at its tip end and is constantly biased by a spring member 44. The stopper member 38 having the stopper claw 38A is inserted into the retaining hole 40 as the module 14 is turned. The stopper claw 38A of the stopper member 38 is thus caught in the retaining hole 40, whereby turning of the module 14 toward its original position is hindered. In order to turn the module 14 toward its original position to detach the module 14 from the base unit 12, the stopper member 38 shown in FIG. 15 is moved backward against the biasing force of the spring member 44 and is disengaged from the retaining hole 40.

Figure 16:
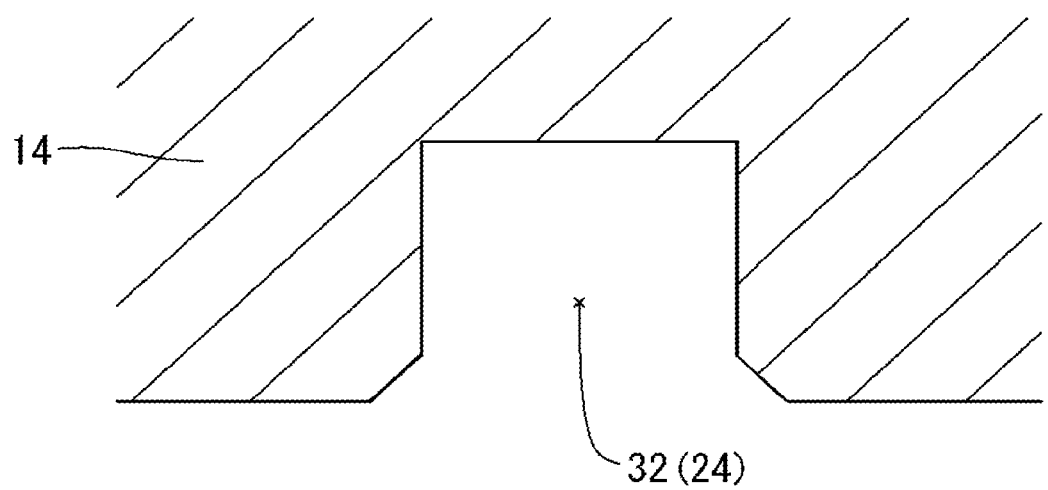
FIG. 16 is a schematic view of a recessed shape formed in a printed circuit board.

FIG. 16 shows a specific configuration of the recess 24 formed in the module 14. The recess 24 is formed by the hole 30 formed in the casing 20 and the recessed shape 32 formed in the printed circuit board 22. The recessed shape 32 formed in the printed circuit board 22 has a tapered shape at its opening so as to have a greater width at the opening. The size of the hole 30 formed in the casing 20 is the same as or larger than that at the opening of the recessed shape 32. This is because the projection 26 is inserted into the recess 24 by turning of the module 14.

Although the present invention is described above with respect to the specific embodiment, the present invention can be carried out in various other forms.

For example, in the present embodiment, the recess 24 and the projection 26 for preventing wrong attachment are provided so that the module 14 has the recess 24 and the base unit 12 has the projection 26. However, the present invention may have the opposite configuration. Namely, the base unit 12 may have the recess 24 and the module 14 may have the projection 26.

In the above embodiment, the connectors 28, the recesses 24, and the projections 26 are positioned such that the connectors 28 are aligned with each other, the recesses 24 are aligned with each other, and the projections 26 are aligned with each other as much as possible. However, the connectors 28, the recesses 24, and the projections 26 need not necessarily be aligned with each other.

The turning support 18 is not limited to the fitting type in which an element is fitted in another element as in the above embodiment, and may be of any detachable type such as the shaft coupling type in which elements are coupled together by a shaft.

What is claimed is:

1. A controller unit, comprising:
    a base unit having a slot;
    a module that includes a printed circuit board and that is mounted in the slot of the base unit;

a pair of male and female connectors, one being included in the base unit and the other being included in the module in order to electrically connect the base unit to the module; and a turning support configuration of a fitting type that allows the module to be turned with respect to the base unit in order to join the pair of connectors together by turning of the module with respect to the base unit; wherein the base unit includes a projection and the module includes a plurality of recesses such that the projection engages with a recess of the plurality of recesses before the pair of connectors are connected together, the recess and the projection are located at positions separated from positions of the pair of connectors in the base unit and the module, and a distance between the positions of the pair of connectors and the positions of the recess and the projection varies depending on a type of combination of the modules that cannot be wrongly joined to the slots, the module includes a casing and the plurality of recesses are a plurality of holes in the casing, and the printed circuit board is mounted in the casing and an edge of the printed circuit board includes a recessed shape at a position corresponding to a position of one hole of the plurality of holes in the casing.

2. The controller unit according to claim 1, wherein each of the recess and the projection is located between a position of the turning support configuration and the position of the connector.

3. The controller unit according to claim 1, wherein a positional relationship between the recess and the projection to be fitted together in a combination that allows the projection to be fitted in the recess and a positional relationship between the pair of male and female connectors to be fitted together are such that, if the module that is going to be attached to the slot is not a right module for that slot, offset contact between the edge of the printed circuit board and the projection occurs before the pair of male and female connectors contact each other.

4. The controller unit according to claim 1, wherein the number of the plurality of holes that are formed in the casing of the module is the same as the number of types of combination of the modules that can be wrongly joined to the slots, and the recessed shape that is formed in the edge of the printed circuit board is formed only for one of the holes.

5. The controller unit according to claim 1, wherein an opening of the recessed shape has a greater width than an inner part of the recessed shape.

6. The controller unit according to claim 1, wherein in terms of a distance from the turning support configuration, the pair of connectors are located at the same position regardless of a type of the module.

7. The controller unit according to claim 1, wherein the projection fits in the recessed shape of the printed circuit board when the module is mounted in the slot of the base unit.

8. The controller unit according to claim 1, wherein the edge of the printed circuit board is configured to contact the projection before the module is mounted in the slot of the base unit at positions corresponding to the other holes of the plurality of holes in the casing.

* * * * *